United States Patent [19]

Chao

[11] Patent Number: 5,686,348
[45] Date of Patent: Nov. 11, 1997

[54] PROCESS FOR FORMING FIELD ISOLATION STRUCTURE WITH MINIMIZED ENCROACHMENT EFFECT

[75] Inventor: Fang-Ching Chao, Hsinchu, Taiwan

[73] Assignee: United Microelectronics Corp., Hsinchu, Taiwan

[21] Appl. No.: 699,791

[22] Filed: Aug. 19, 1996

[51] Int. Cl.⁶ .................................................. H01L 21/76
[52] U.S. Cl. .................................................. 437/70
[58] Field of Search ............... 437/69, 70; 148/DIG. 85, 148/DIG. 86, DIG. 117

[56] References Cited

U.S. PATENT DOCUMENTS

| | | |
|---|---|---|
| 4,829,019 | 5/1989 | Mitchell et al. . |
| 5,105,829 | 4/1992 | Shida . |
| 5,208,181 | 5/1993 | Chi . |
| 5,286,672 | 2/1994 | Hodges et al. . |
| 5,432,118 | 7/1995 | Orlowski et al. ........................ 437/69 |

FOREIGN PATENT DOCUMENTS

| | | |
|---|---|---|
| 63-261729 | 10/1988 | Japan . |
| 2-117150 | 5/1990 | Japan . |

Primary Examiner—George Fourson
Attorney, Agent, or Firm—Christensen O'Connor Johnson & Kindness

[57] ABSTRACT

A method for minimizing the impurity encroachment effect of the field isolation structures for NMOS, PMOS and CMOS integrated circuits is disclosed. In the process, a first layer and a second layer are deposited on a laminate comprising a substrate having thereon the stacked layers. A photo-resist mask which defines the isolation regions is then formed and the unmasked portion is removed. A third layer is deposited and then is etched anisotropically to form the spacers. A fourth layer is deposited and the chemical-mechanical polishing (CMP) method is applied until the first layer is exposed. After the first layer is removed, the channel-stop ions are implanted, and the spacers are removed for forming the isolation regions by the oxidation. As a result, the channel stop region is self-aligned to the resulting field oxide and the isolation structure is free of the impurity encroachment effect.

38 Claims, 11 Drawing Sheets

5,686,348

PROCESS FOR FORMING FIELD ISOLATION STRUCTURE WITH MINIMIZED ENCROACHMENT EFFECT

BACKGROUND OF THE INVENTION

1. Field of the Invention

The present invention relates to a method for forming the isolation regions among devices on a semiconductor substrate, and more particularly to a method for forming the field isolation structure with the minimized impurity encroachment effect.

2. Description of the Prior Art

The art of isolating devices that are built on a semiconductor substrate becomes one important aspect of modem metal-oxide-semiconductor (MOS) and bipolar integrated circuit technology as many as hundreds of thousands of devices are used in a single chip. Improper isolation among transistors will cause current leakages, which can consume significant power for the entire chip. In addition, improper isolation can further escalate latchup to damage the circuit function momentarily or permanently. Still further, improper isolation can result in noise margin degradation, voltage shift or crosstalk. In complementary MOS (CMOS) technology, adequate isolation provided between opposite-type transistors is important as well as between same-type transistors.

In MOS technology, isolation is usually practiced by forming the isolation regions between neighboring active regions. Typically, an isolation region is formed by ion-doping a channel stop of polarity opposite to the source electrode and the drain electrode of the integrated circuit device, and growing a thick oxide, often referred to as field oxide (FOX). The channel stop and the FOX cause the threshold voltage in the isolation region to be much higher than those of the neighboring active devices, making surface inversion not occur under the field oxide region.

The conventional LOCOS (LOCal Oxidation of Silicon) process is used to develop regions which laterally isolate the active devices on the integrated circuits. The LOCOS structure is typically formed by using a patterned silicon nitride layer together with a pad oxide, which is utilized to release stress caused by the silicon nitride layer, underneath to mask the active regions, followed by ion-implantation in the isolation region and then growing a thick field oxide locally. Another structure similar to the LOCOS is the Buffered Polysilicon LOCOS (BPL) isolation process, which uses a sandwich of a pad oxide having thereon a polysilicon layer, and a silicon nitride layer on the polysilicon layer.

Both structures mentioned above possess some inherent drawbacks resulting from the processes, i.e., lateral oxidation of the silicon underneath the silicon nitride mask, making the edge of the field oxide resemble a bird's beak, and the lateral diffusion of channel-stop dopants, making the dopants encroach into the active device regions. Both effects overtake the active device regions, making the physical channel width less than the desired channel width. The reduced portion overtaken by both effects will make the situation even worse when devices are scaled down for very large scale integration (VLSI) implementation, increasing threshold voltage and reducing the current driving capability. Furthermore, p-channel devices and n-channel devices in CMOS process require extra steps strictly to achieve the isolation between the opposite-type devices as well as between the same-type devices.

Several methods in the prior art have been designed for improving LOCOS or BPL isolation processes to minimize the transition regions between active areas. For example, the side wall masked isolation (SWAMI) process has been proposed which involves the addition of a second silicon nitride layer on the side wall. The SWAMI offers basically near-zero bird's beak, but at the expense of process complexity. Another method in the prior an is the sealed-interface local oxidation (SILO) process which uses three layers of a silicon nitride over the silicon substrate followed by an oxide layer and a cap silicon nitride layer. The SILO can reduce the bird's beak, but at the expense of generating more stress, more crystal defects, and higher leakage currents. Also, the buried oxide (BOX) process has been devised which uses an aluminum mask to etch a silicon groove and the subsequent removal of a plasma deposited silicon dioxide layer. The BOX process can reduce the bird's beak but, however, at the expense of manufacture complexity. Although numerous techniques have been devised for improving the LOCOS or the BPL isolation process to minimize bird's beak effect, none of these effectively overcomes the dopant encroachment problems.

SUMMARY OF THE INVENTION

It is therefore a primary object of this invention to provide an improved method for minimizing the encroachment effect of field isolation structures.

It is another object of the invention to provide an improved method of the local oxidation of silicon (LOCOS) and the buffered polysilicon LOCOS (BPL) structures.

It is a further object of the present invention to provide a method for forming the field isolation structure with self-aligned channel stop regions for N-channel MOS (NMOS), P-channel MOS (PMOS) and CMOS integrated circuits.

According to the present invention, an improved method is provided to define isolation structures between active regions with minimized impurity encroachment effects, i.e., the lateral diffusion of implanted ions due to oxidation processes during the formation of isolation regions. This technique finds several applications in the processing of silicon wafers for NMOS, PMOS or CMOS integrated circuits. The term MOS is used herein to include silicon gate technology.

In the process, a first layer and a second layer are deposited on a laminate comprising a substrate having thereon the stacked layers. A photo-resist mask which defines the isolation regions is then formed and the unmasked portion is removed. A third layer is deposited and then is etched anisotropically to form the spacers. A fourth layer is deposited and the chemical-mechanical polishing (CMP) is performed until the first layer is exposed. After the first layer is removed, channel-stop ions are implanted, and the spacers is removed for forming the isolation regions by the oxidation. As a result, the channel stop region is self-aligned to the resulting field oxide and the isolation structure is substantially free of the impurity encroachment effect.

DESCRIPTION OF THE PREFERRED EMBODIMENTS

Figure 1A:
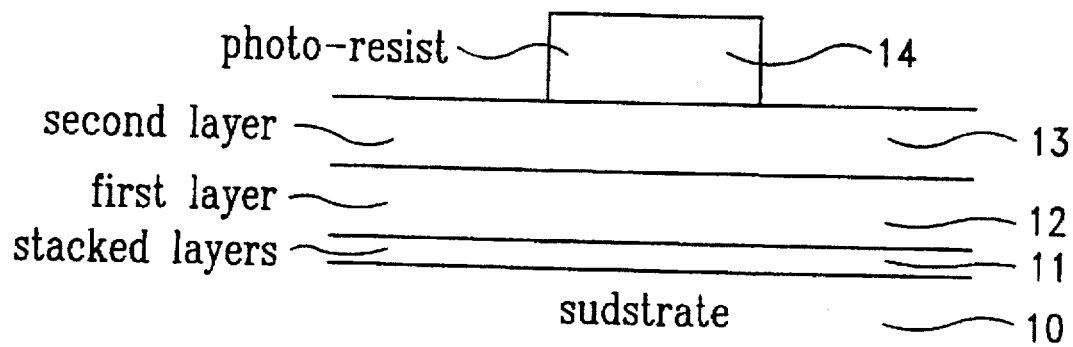
FIGS. 1A to 1I schematically show the steps for forming an isolation region according to one embodiment of the present invention.
Figure 1B:
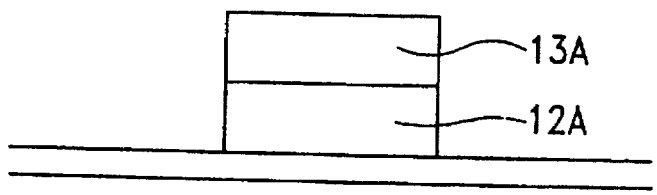
Figure 1C:
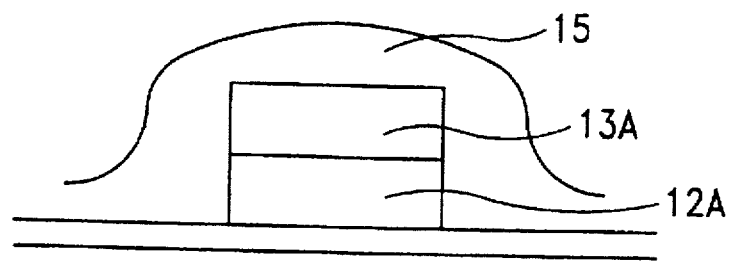
Figure 1D:
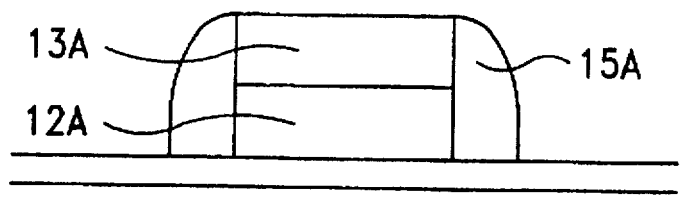

FIGS. 1A to 1I illustrate one embodiment of the present invention. FIG. 1A represents the initial stage wherein a substrate 10 has grown thereon the stacked layers 11. A first layer 12, e.g., a polysilicon layer, is deposited by way of chemical vapor deposition (CVD) to a thickness of about 2000 Å on the stacked layers 11, and a second layer 13, e.g., a CVD silicon oxide layer having a thickness of about 2000 Å, is deposited on the first layer 12. Then a photo-resist 14 is used to define the isolation regions. The unmasked portions of the second layer 13 and the first layer 12 are etched anisotropically, preferably by a reactive ion etching (RIE), resulting a structure shown in FIG. 1B. Atop of the second layer 13A is deposited, by way of CVD, a third layer 15, e.g., a silicon oxide layer, as depicted in FIG. 1C. The next step in the process, as shown in FIG. 1D, is the anisotropic etching of the third layer 15 by way of a reactive-ion etch (RIE) in order to form spacers 15A, which are used for aligning the channel stop ions to the field oxide described hereinafter.

Figure 1E:
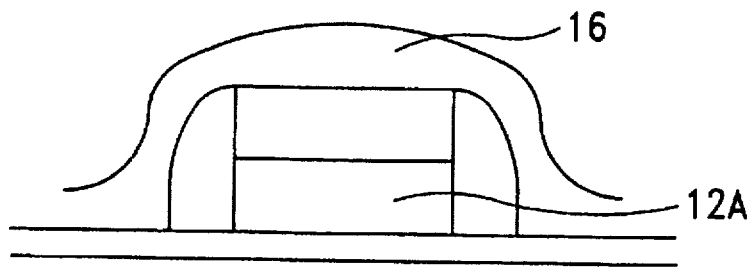
Figure 1F:
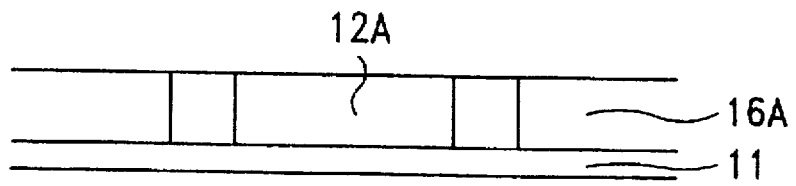

After the spacer are formed, a fourth layer 16, e.g., a CVD silicon nitride layer, is deposited over the entire structure of FIG. 1D, and a conventional Chemical-Mechanical Polishing (CMP) method is used to planarize the structure of FIG. 1E until the first layer 12A is exposed, resulting the structure shown in FIG. 1F.

Figure 1G:
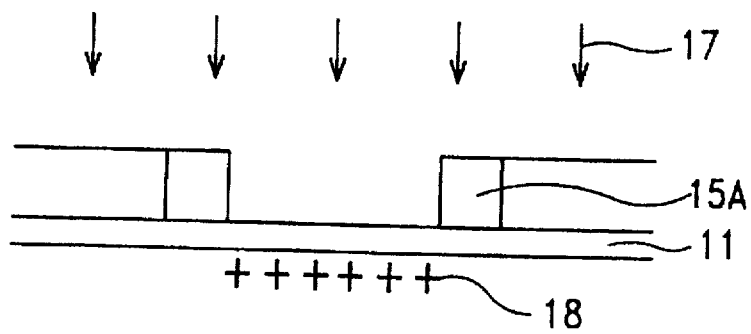

The first layer 12A and/or the portions of the stacked layers 11 are BOE etched and the structure shown in FIG. 1G is next subjected to the ion implantation 17, for example, boron ion implantation, which makes the ion-implanted region 18, i.e. the channel stop region, self-aligned to the inner edges of the spacers 15A so as to minimize the impurity encroachment effect. This process can be applied to NMOS, PMOS and CMOS circuits. For example, in a PMOS embodiment, phosphorus ions are implanted.

Figure 1H:
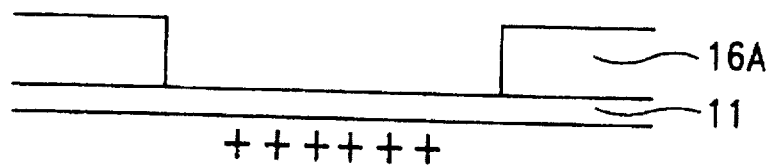
Figure 1I:
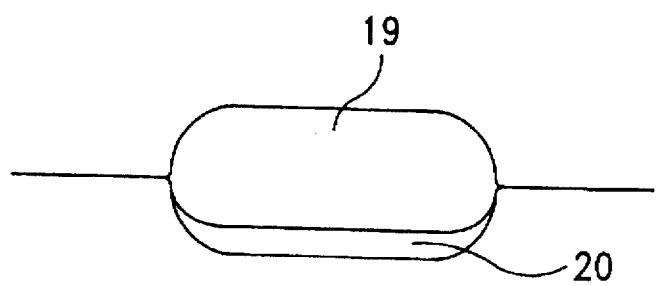

After the ion-implantation step, the spacers 15A and/or the portions of the stacked layers 11 are BOE etched, and then the structure shown in FIG. 1H is subjected to a thermal oxidation, preferably by way of high pressure oxidation at 1000° C. at atmospheres, to form a field oxide region 19, which is typically 3000–10000 Å. As a result, the and a channel stop region 20 underneath the field oxide region 19 substantially reduces the impurity encroachment effect, as shown in FIG. 1I. The final step in the process is the removal of the fourth layer 16 and the stacked layers 11 in a boiling phosphoric acid solution (85% $H_3PO_4$ at 180° C.) and in a dilute HF respectively.

Figure 2A:
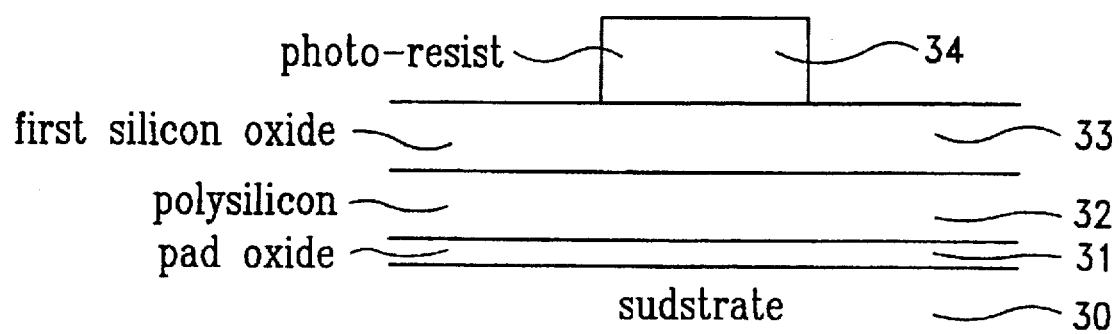
FIGS. 2A to 2M schematically show the steps for forming an isolation region for the LOCOS structure according to another embodiment of the present invention.
Figure 2B:
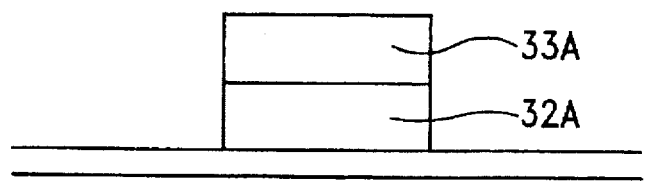
Figure 2C:
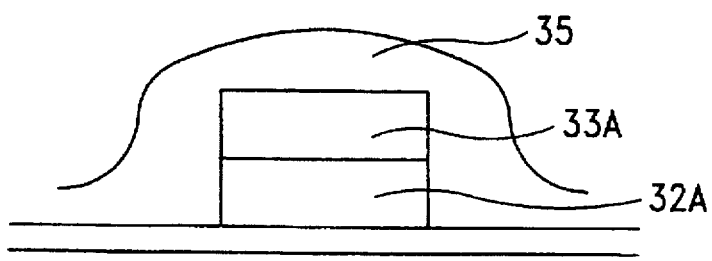

FIGS. 2A to 2M show another preferred embodiment of the present invention for forming the isolation regions of the LOcal Oxidation of Silicon (LOCOS) structure. FIG. 2A represents the initial stage wherein a substrate 30 of p-type or n-type has grown thereon a pad oxide 31 having a thickness of about 300–500 Å. A polysilicon layer 32 having a thickness of about 2000 Å is deposited by way of CVD on the pad oxide 31, and a CVD first silicon oxide layer 33 having a thickness of about 2000 Å is deposited on the polysilicon layer 32. Then a photo-resist 34 is used to define the isolation regions, and the unmasked portions of the first silicon oxide layer 33 and the polysilicon layer 32 are removed, for example, by a dilute HF, resulting the structure shown in FIG. 2B. Atop of the first silicon oxide layer 33 is deposited a CVD second silicon oxide layer 35 as depicted in FIG. 2C. The next step in the process as shown in FIG. 2D is the anisotropic etching of the second silicon oxide layer 35 by way of a RIE in order to form the spacers 35A having a width of about 2000 Å, which are used for aligning the channel stop to the field oxide described hereinafter.

Figure 2D:
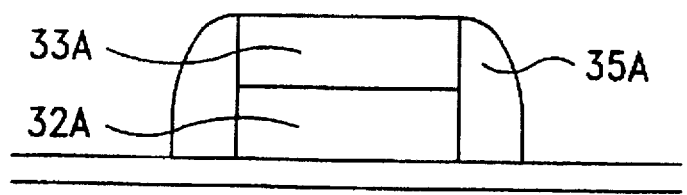
Figure 2E:
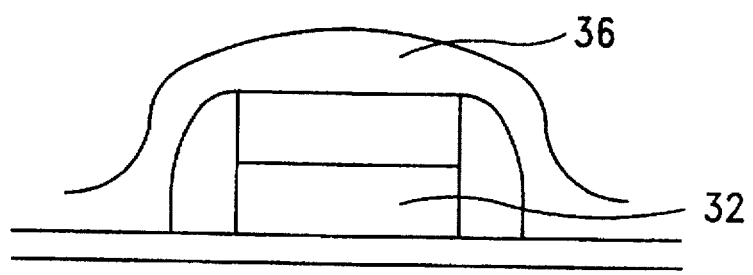
Figure 2F:
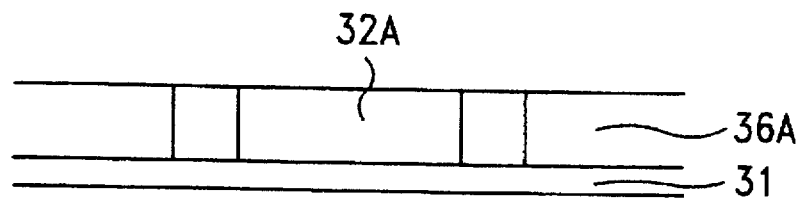

After forming the spacers, a CVD silicon nitride layer 36 having a thickness of about 1000–2000 Å is deposited over the entire structure of FIG. 2D, and the Chemical-Mechanical Polishing (CMP) method is applied to planarize the structure of FIG. 2E until the polysilicon layer 32A is exposed, resulting the structure shown in FIG. 2F.

Figure 2G:
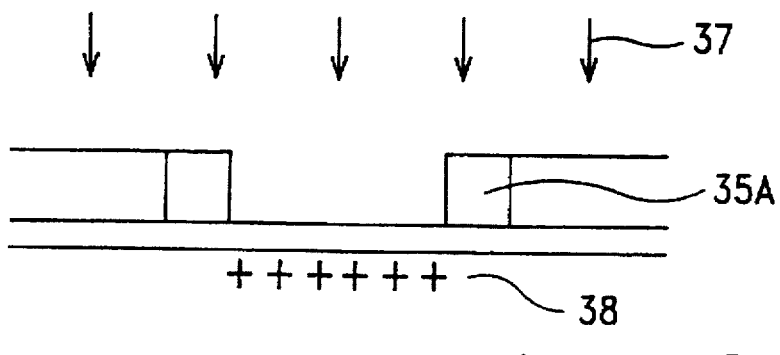

The polysilicon layer 32A is removed by, for example, BOE, and the structure shown in FIG. 2G is next subjected to the ion implantation 37, e.g., boron ions implantation for fabricating the n-channel devices. Consequently, the ion-implanted region 38, i.e. channel stop region, is self-aligned to the inner edges of the spacers 35 so as to minimize the impurity encroachment effect. If the present invention is practiced for p-channel device, the implanted ions are donors such as the phosphorus ions.

Figure 2H:
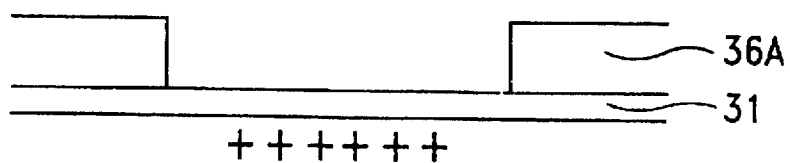
Figure 2I:
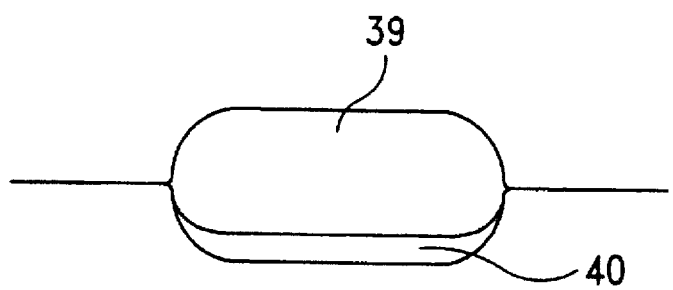

After the ion-implantation step, the spacers 35A are removed, and then the structure shown in FIG. 2H is subjected to thermal oxidation as described above to form a field oxide region 39, which is typically about 3000–10000 Å. As a result, the channel stop region 40 underneath the field oxide region 39 substantially reduces the impurity encroachment effect. The final step in the process is the removal of the silicon nitride layer 36 and the pad oxide 31 in a boiling $H_3PO_4$ and in a dilute HF respectively.

Figure 2J:
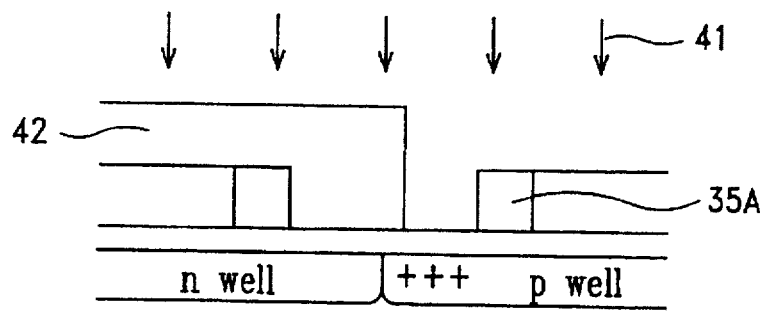
Figure 2K:
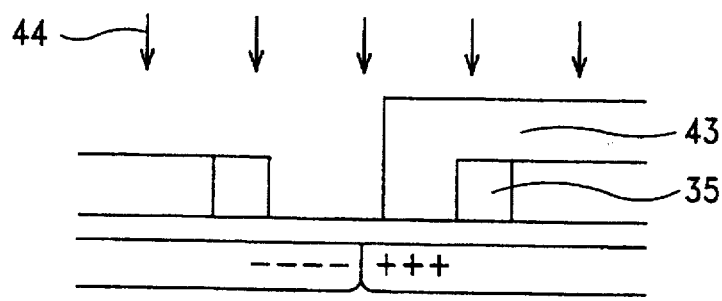

In CMOS devices fabrication process, an extra step and some more masks are required to isolate both the n-type and the p-type devices on the same chip. For clarity of the following description, the twin-well method is used, while it is well understood that other methods, such as using the n-well on the p-type substrate or using the p-well on the n-type substrate, could be applied equally. After performing the process as described above in conjunction with FIGS. 2A–2F, the rest of the process is described below in conjunction with FIGS. 2J–2M. Referring to FIG. 2J, the active regions of the p-type devices are masked by the photo-resist 42, and the mask 42 is removed after the ions 41 of p-type, e.g., boron ions, are implanted. Then the active regions of the n-type devices are masked by the photo-resist 43, and the mask 43 is removed after the ions 44 of n-type, e.g., phosphorus ions, are implanted. Because the pile-up effect of the n-type impurity during oxidation will increase the impurity profile in silicon, the step described in FIG. 2K is usually omitted except when fabricating the high voltage devices.

Figure 2L:
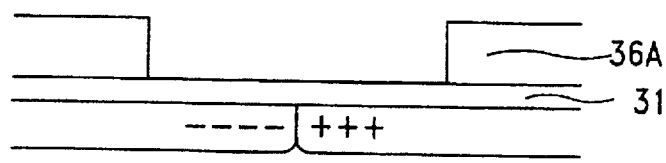
Figure 2M:
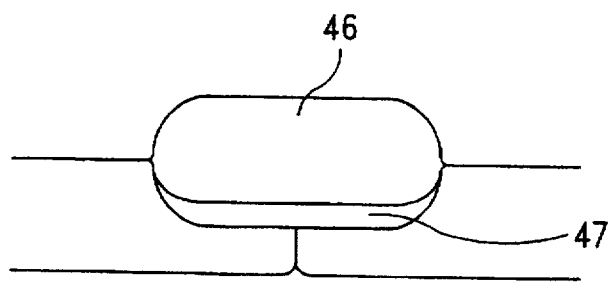

After the ion-implantation step, the spacers 35A are removed, and then the structure shown in FIG. 2L is subjected to a thermal oxidation, preferably by way of high pressure oxidation at 1000° C. at 10 atmospheres, to form a field oxide region 46, which is typically about 3000–10000 Å. The channel stop region 47 underneath the field oxide region 46 substantially reduces the impurity encroachment effect as shown in FIG. 2M. The final step in the process is the removal of the silicon nitride layer 36A and the pad oxide 31 in a boiling $H_3PO_4$ and in a dilute HF respectively.

Figure 3A:
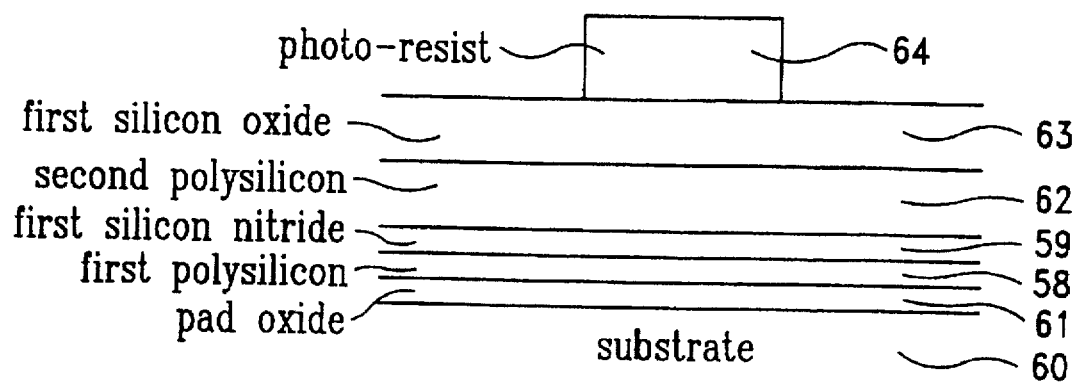
FIGS. 3A to 3M schematically show the steps for forming an isolation region for the BPL structure according to another embodiment of the present invention.
Figure 3B:
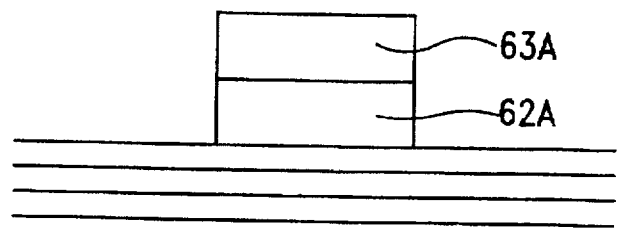
Figure 3C:
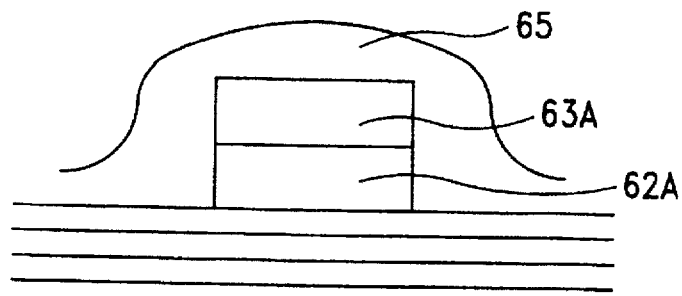

FIGS. 3A to 3M show another preferred embodiment of the present invention for forming the isolation regions of the Buffered Polysilicon LOCOS (BPL) structure. FIG. 3A represents the initial stage wherein a substrate 60 of type p or type n has grown thereon a pad oxide 61 which is typically about 100–300 Å, a first polysilicon layer 58 which is typically about 250–400 Å, and a first silicon nitride layer 59 which is typically about 1000–2000 Å. A second polysilicon layer 62 having a thickness of about 2000 Å is deposited by way of CVD on the first silicon nitride layer 59, and a first silicon oxide layer 63 having a thickness of about 2000 Å is deposited by way of CVD on the second polysilicon layer 62. Then a photo-resist 64 is used to define the isolation regions, and the unmasked portions of the first silicon oxide layer 63 and the second polysilicon layer 62 are removed, for example, by a dilute HF, resulting the structure shown in FIG. 3B. Atop of the first silicon oxide layer 63 is deposited a CVD second silicon oxide layer 65 as depicted in FIG. 3C. The next step in the process as shown in FIG. 3D is the anisotropic etching of the second silicon oxide layer 65 by way of a RIE in order to form the spacers 65A having a width of about 2000 Å, which are used for aligning the channel stop to the field oxide described hereinafter.

Figure 3D:
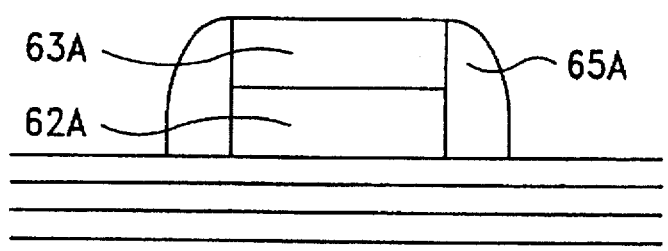
Figure 3E:
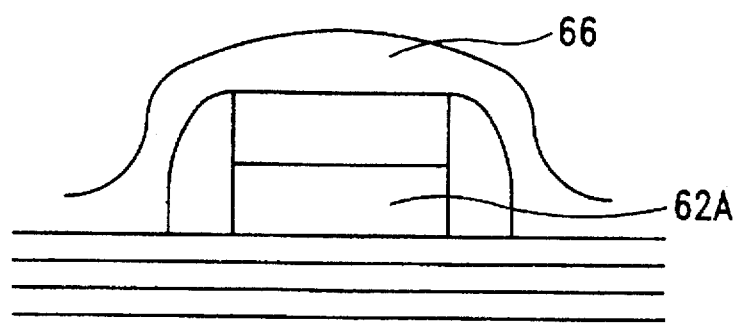
Figure 3F:
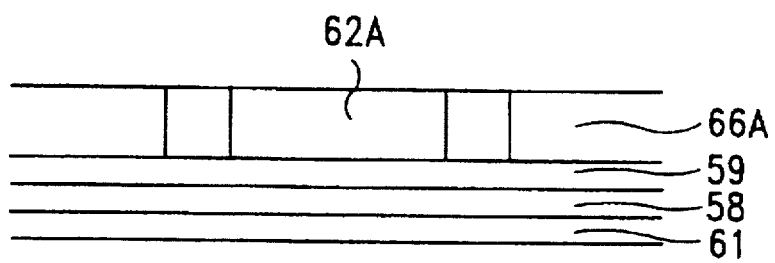

After forming the spacers, a CVD second silicon nitride layer 66 having a thickness of about 1000~2000 Å is deposited over the entire structure of FIG. 3D, and the Chemical-Mechanical Polishing (CMP) method is applied to planarize the structure of FIG. 3E until the second polysilicon layer 62A is exposed, resulting the structure shown in FIG. 3F.

Figure 3G:
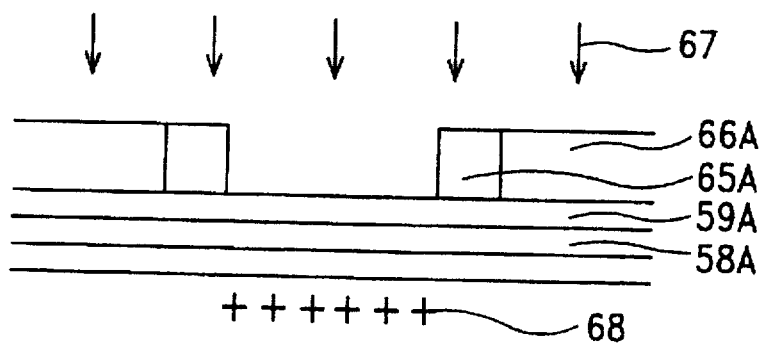

The second polysilicon layer 62A, the first silicon nitride layer 59, the first polysilicon layer 58 and/or the pad oxide 61 are etched anisotropically by, for example BOE, and the structure shown in FIG. 3G is next subjected to the ion implantation 67, e.g., boron ions implantation for fabricating the n-channel devices. Consequently, the ion-implanted region 68, i.e. channel stop region, is self-aligned to the inner edges of the spacers 65A so as to minimize the impurity encroachment effect. If the present invention is practiced for p-channel device, the implanted ions are donors such as the phosphorus ions.

Figure 3H:
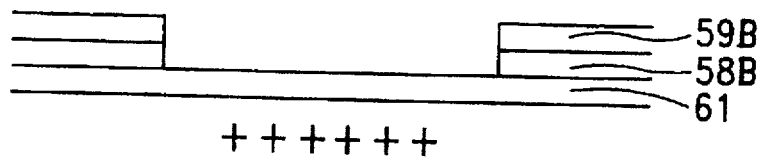
Figure 3I:
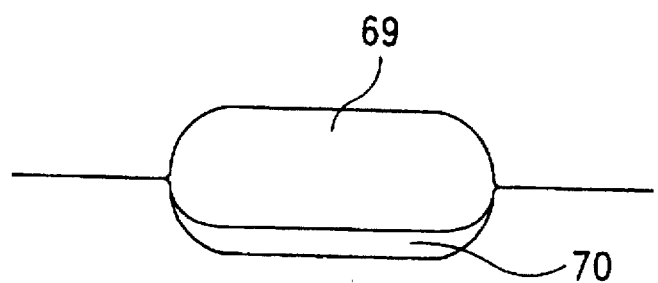

After the ion-implantation step, the spacers 65A are removed, and the oxide regrowth is optionally applied. The first silicon nitride layer 59A and the first polysilicon layer 58A are etched anisotropically by using the second nitride layer 66A as a mask. The second silicon nitride layer 66 is removed, and the structure shown in FIG. 3H is subjected to thermal oxidation as described above to form a field oxide region 69, which is typically 3000~10000 Å. As a result, the channel stop region 70 underneath the field oxide region 69 substantially reduces the impurity encroachment effect. The final step in the process is the removal of the first silicon nitride layer 59B, the first polysilicon layer 58B and the pad oxide 61 in a boiling $H_3PO_4$ for etching the first silicon nitride layer 59B, and in a dilute HF for etching the first polysilicon layer 58B and the pad oxide 61.

Figure 3J:
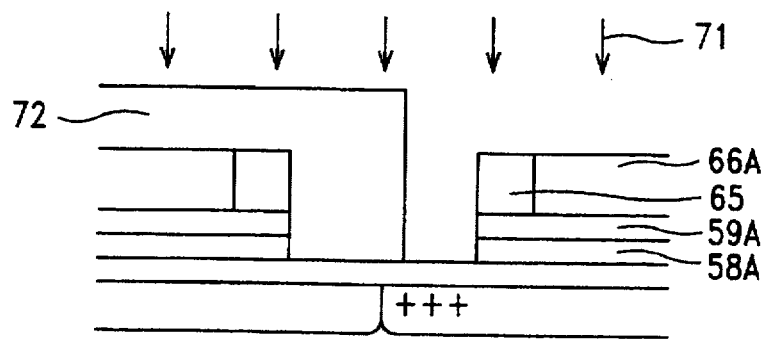
Figure 3K:
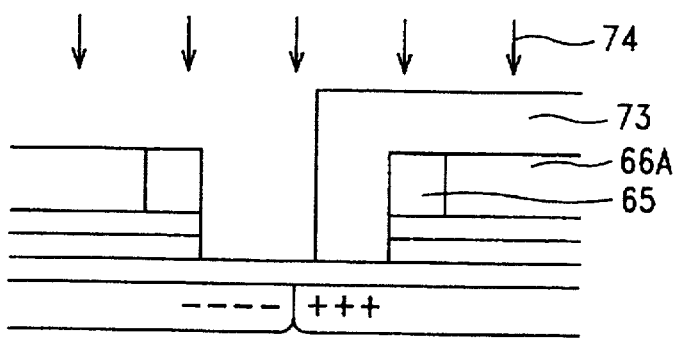

In CMOS devices fabrication process, an extra step and some more masks are required to isolate both the n-type and the p-type devices on the same chip. For clarity of the following description, the twin-well method is used while it is well understood that other methods, such as using the n-well on the p-type substrate or using the p-well on the n-type substrate, could be applied equally. After performing the process as described in conjunction with FIGS. 3A–3F, the rest of the process is described below in conjunction with FIGS. 3J–3M. Referring to FIG. 3J, the active regions of the p-type devices are masked by the photo-resist 72, and the mask 72 is removed after the ions 71 of p-type, e.g., boron ions, are implanted. Then the active regions of the n-type devices are masked by the photo-resist 73, and the mask 73 is removed after the ions 74 of n-type, e.g., phosphorus ions, are implanted. Because the pile-up effect of the n-type impurity during oxidation will increase the impurity profile in silicon, the step described in FIG. 3K is usually omitted except when fabricating the high voltage devices.

Figure 3L:
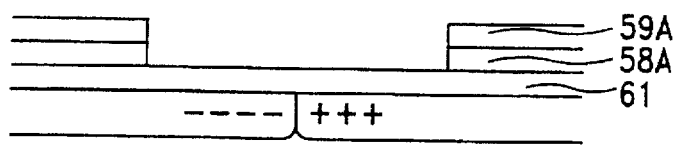
Figure 3M:
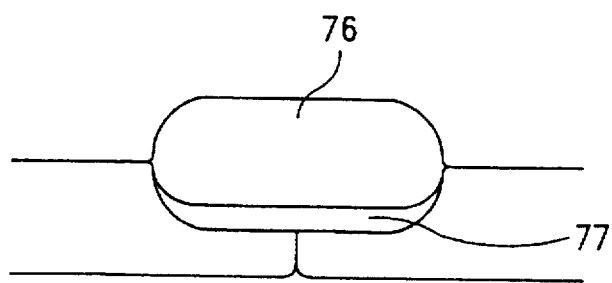

After the ion-implantation step, the spacers 65A are removed, and the oxide regrowth is optionally applied. The first silicon nitride layer 59A and the first polysilicon layer 58A are etched anisotropically by using the second nitride layer 66A as a mask. The second silicon nitride layer 66A is removed, and the structure shown in FIG. 3L is subjected to thermal oxidation as described above to form a field oxide region 76, which is typically 3000~10000 Å. As a result, the channel stop region 77 underneath the field oxide region 76 substantially reduces the impurity encroachment effect as shown in FIG. 3M. The final step in the process is the removal of the first silicon nitride layer 59B, the first polysilicon layer 58B and the pad oxide 61 in a boiling $H_3PO_4$ for etching the first silicon nitride layer 59B, and in a dilute HF for etching the first polysilicon layer 58B and the pad oxide 61.

The specific embodiments described above are illustrative of the principles of the invention and are not intended to limit the invention to the embodiments described. For example, stacked layers different from those described may be used in other embodiments. Of course, different dopants in different dosage and layers of different thickness may be used in other embodiments. Accordingly, although specific embodiments have been illustrated and described, it will be obvious to those skilled in the art that various modification may be made without departing from the spirit and the scope of the invention, which is intended to be limited solely by the appended claims.

What is claimed is:

1. A process for forming isolation regions on a semiconductor substrate, the process comprising:

forming a first layer on a laminate comprising a substrate having thereon stacked layers;

defining isolation regions by forming a photo-resist mask over the first layer;

removing an unmasked portion, wherein portions of the stacked layers are exposed;

forming a third layer above the first layer;

etching anisotropically the third layer to form spacers on the side walls of the first layer;

forming a fourth layer over the spacers and the first layer;

chemical-mechanical polishing (CMP) until the first layer is exposed thereby, planarizing the first layer, the spacers and the fourth layer;

removing the first layer;

implanting ions into the substrate, wherein the planarized spacers and the fourth layer forming an implant mask;

removing the spacers; and oxidation so as to form the isolation regions.

2. The process according to claim 1 further comprising, after the first layer is formed, forming a second layer on the first layer.

3. The process according to claim 1 further comprising, after the first layer is removed, removing the stacked layers.

4. The process according to claim 1 further comprising, after the third layer is removed, removing the stacked layers.

5. The process according to claim 1 further comprising, after oxidation, removing the fourth layer and the stacked layers.

6. The process according to claim 1, wherein said first layer is a polysilicon layer.

7. The process according to claim 1, wherein said second layer is a silicon oxide layer.

8. The process according to claim 1, wherein said third layer is a silicon oxide layer.

9. The process according to claim 2, wherein said fourth layer is a silicon nitride layer.

10. A process for forming isolation regions on a semiconductor substrate, the process comprising:

forming a polysilicon layer on a laminate comprising a substrate having thereon a pad oxide;

forming a first silicon oxide layer on the polysilicon layer;

defining isolation regions by forming a photo-resist mask over the first silicon oxide layer;

removing unmasked portions of the first silicon oxide layer and the polysilicon layer;

forming a second silicon oxide layer over the first silicon oxide layer;

etching anisotropically the second silicon oxide layer to form spacers on the side walls of the polysilicon layer and the first silicon oxide layer;

forming a silicon nitride layer above the spacers and the first silicon oxide layer;

chemical-mechanical polishing (CMP) until the polysilicon layer is exposed, thereby planarizing the polysilicon layer, the spacer and the silicon nitride layer;

removing the polysilicon layer;

implanting ions of a first type into the substrate, wherein the planarized spacer and the silicon nitride layer serving as an implant mask;

removing the spacers; and oxidation so as to form the isolation regions.

11. The process according to claim 10 further comprising, after oxidation, removing the silicon nitride layer and the pad oxide.

12. The process according to claim 10, wherein said substrate is of p-type and said implanted ions are of p-type.

13. The process according to claim 12, wherein said substrate is of n-type and said implanted ions are of n-type.

14. The process according claim 10, wherein said substrate comprises n-type regions and p-type regions.

15. The process according to claim 14, wherein said substrate is of n-type or of p-type.

16. The process according to claim 15 further comprising, after removing the polysilicon layer, masking active regions of the first type, and removing the first-type active region mask after the ions of the first type are implanted.

17. The process according to claim 16 further comprising, after implanting said ions of the first type, masking active regions of a second type, implanting ions of the second type and removing the second-type active region mask.

18. The process according to claim 10, wherein the thickness of the pad oxide is 300~500 Å.

19. The process according to claim 10, wherein the thickness of the polysilicon layer is about 2000 Å.

20. The process according to claim 10, wherein the thickness of the first silicon oxide layer is about 2000 Å.

21. The process according to claim 10, wherein the thickness of the silicon nitride layer is 1000~2000 Å.

22. The process according to claim 10, wherein the width of the spacers is about 2000 Å.

23. A process for forming isolation regions on a semiconductor substrate, the process comprising:

forming a second polysilicon layer on a laminate comprising a substrate having thereon a pad oxide, a first polysilicon layer on the pad oxide and a first silicon nitride layer on the first polysilicon layer;

forming a first silicon oxide layer on the second polysilicon layer;

defining isolation regions by forming a photo-resist mask over the first silicon oxide layer;

removing unmasked portions of the first silicon oxide layer and the second polysilicon layer;

forming a second silicon oxide layer over the first silicon oxide layer; etching anisotropically the second silicon oxide layer to form spacers on the side walls of the second polysilicon layer and the first silicon oxide layer; forming a second silicon nitride layer above the spacers, the first silicon oxide layer and the first silicon nitride layer;

chemical-mechanical polishing (CMP) until the second polysilicon layer is exposed thereby planarizing the spacers, the second polysilicon layer and the second silicon nitride layer;

etching anisotropically the second polysilicon layer, the first silicon nitride layer and the first polysilicon layer;

implanting ions of a first type into the substrate, wherein the spacers and the second silicon nitride serving as an implant mask;

removing the spacers;

etching anisotropically portions of the first silicon nitride layer and the polysilicon layer, wherein the second silicon nitride layer serving as a mask;

removing the second silicon nitride layer; and oxidation so as to form the isolation regions.

24. The process according to claim 23 further comprising, after oxidation, removing the first silicon nitride layer, the first polysilicon layer and the pad oxide.

25. The process according to claim 23, wherein said substrate is of p-type and said implanted ions are of p-type.

26. The process according to claim 25, wherein said substrate is of n-type and said implanted ions are of n-type.

27. The process according to claim 23, wherein said substrate comprises n-type regions and p-type regions.

28. The process according to claim 27, wherein said substrate is of n-type or of p-type.

29. The process according to claim 28 further comprising, before implanting ions, masking active regions of the first type, and removing the first-type active region mask after the ions of the first type are implanted.

30. The process according to claim 29 further comprising, after implanting said ions of the first type, masking active regions of a second type, implanting ions of the second type and removing the second-type active region mask.

31. The process according to the claim 23 further comprising, after etching the first polysilicon layer, removing the pad oxide.

32. The process according to claim 23 further comprising, before removing the second silicon nitride layer, regrowing oxide.

33. The process according to claim 23, wherein the thickness of the pad oxide is 100~300 Å.

34. The process according to claim 23, wherein the thickness of the first polysilicon layer is 250~400 Å.

35. The process according to claim 23, wherein the thickness of the first silicon nitride layer is 1000~2000 Å.

36. The process according to claim 23, wherein the thickness of the second polysilicon layer is about 2000 Å.

37. The process according to claim 23, wherein the thickness of the first silicon oxide layer is about 2000 Å.

38. The process according to claim 23, wherein the width of the spacers is about 2000 Å.

* * * * *